United States Patent
Kufer

(10) Patent No.: US 7,482,960 B2
(45) Date of Patent: Jan. 27, 2009

(54) ARRANGEMENT FOR THE SYNCHRONOUS OUTPUT OF ANALOG SIGNALS GENERATED IN TWO OR MORE DIGITAL-TO-ANALOG CONVERTERS

(75) Inventor: Wolfgang Kufer, Muehldorf (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 0 days.

(21) Appl. No.: 11/664,947

(22) PCT Filed: Oct. 17, 2005

(86) PCT No.: PCT/EP2005/011153

§ 371 (c)(1),
(2), (4) Date: Jul. 2, 2007

(87) PCT Pub. No.: WO2006/042731

PCT Pub. Date: Apr. 27, 2006

(65) Prior Publication Data

US 2008/0094265 A1      Apr. 24, 2008

(30) Foreign Application Priority Data

Oct. 18, 2004   (DE) .................... 10 2004 050 648

(51) Int. Cl.
H03M 1/66   (2006.01)

(52) U.S. Cl. .................................... 341/144

(58) Field of Classification Search ............. 341/155, 341/144, 61, 157, 132

See application file for complete search history.

(56) References Cited

U.S. PATENT DOCUMENTS

| | | | |
|---|---|---|---|
| 3,518,680 A | 6/1970 | McAuliffe ............ 343/205 |
| 4,400,719 A * | 8/1983 | Powers ................ 348/450 |
| 5,055,939 A | 10/1991 | Karamon et al. ...... 358/341 |
| 5,677,737 A * | 10/1997 | den Hollander ....... 348/445 |
| 5,715,275 A * | 2/1998 | Emi ..................... 375/134 |
| 5,930,299 A | 7/1999 | Vannatta et al. ....... 375/269 |
| 7,054,382 B2 * | 5/2006 | Lee ...................... 375/295 |
| 2002/0150185 A1 | 10/2002 | Meehan et al. ........ 375/347 |
| 2003/0112894 A1 | 6/2003 | Lee ...................... 375/308 |
| 2004/0179587 A1 | 9/2004 | Kenington et al. ..... 375/219 |

FOREIGN PATENT DOCUMENTS

DE        1 762 655      7/1970

* cited by examiner

*Primary Examiner*—Brian Young
(74) *Attorney, Agent, or Firm*—Marshall, Gerstein & Borun LLP

(57) ABSTRACT

To achieve a synchronous output of analog signals generated in two or more digital-to-analog (DAC) converters, an adjustable, digital delay device, of which the delay time is adjustable dependent upon the cross-correlation determined between the analog output signals of the digital-to-analog converters, is provided upstream of at least one of the fifo memories provided for the signal transfer in order to delay the digital signal.

6 Claims, 2 Drawing Sheets

ARRANGEMENT FOR THE SYNCHRONOUS OUTPUT OF ANALOG SIGNALS GENERATED IN TWO OR MORE DIGITAL-TO-ANALOG CONVERTERS

BACKGROUND OF THE INVENTION

1. Field of the Invention

The invention relates to an arrangement for the synchronous output of analog signals generated in two or more digital-to-analog converters.

2. Related Technology

Conventional digital-to-analog conversion generally uses two mutually-synchronous clock pulses. In this context, one clock pulse controls the digital component, while another clock pulse with special requirements regarding the purity of the clock pulse controls the actual converter. The signals are generally transferred between these clock pulses in a synchronous manner, that is to say, with a known delay. With fast clock-pulse rates, maintaining the corresponding set-up and hold times at the transfer interface becomes increasingly difficult, and accordingly, a fifo (first-in-first-out memory) is connected in series to the actual converter for the transfer of the signals. This fifo memory is generally integrated in the converter. This arrangement does in fact allow a synchronization with constant delay of the signal, dependent upon the initialization of the fifo memory; however, the delay can assume different values. Accordingly, the intermediate connection of a fifo memory has so far not completely resolved the problem at fast clock-pulse rates.

A special problem occurs, if analog signals generated in this manner must be generated synchronously relative to one another or synchronously relative to a marker signal, which is in fact generated together with the digital signal generating the analog signals, but not output via the digital-to-analog converter. In this case, the uncertain phase position of the analog signals relative to the marker signal is critical.

SUMMARY OF THE INVENTION

The invention therefore provides an arrangement and a method, which allows an accurate synchronization of analog signals generated in two or more digital-to-analog converters.

Accordingly the invention provides an arrangement for the synchronous output of analog signals generated in at least two digital-to-analog converters, wherein the digital signals are generated at a first clock-pulse frequency and converted into analog signals in the digital-to-analog converters at a second clock-pulse frequency, and the signal is transferred with a delay to the digital-to-analog converters via a fifo memory, comprising an adjustable digital delay device for delaying the digital signals, of which the delay time is adjustable dependent upon the cross-correlation determined between the analog output signals of the digital-to-analog converters upstream of a fifo memory upstream of at least one of the digital-to-analog converters.

The invention also provides a method for adjusting an arrangement for the synchronous output of analog signals with associated marker signals generated in at least two digital-to-analog converters, comprising initially adjusting the digital delay devices assigned to the digital-to-analog converters to a delay time of zero, then supplying a synchronization pattern as a digital signal with assigned marker signal, altering the delay of the marker signal adjustable digital delay device assigned to the latter, and simultaneously marking the cross-correlation function between the analog signals of the digital-to-analog converters and the marker signal, determining the maximum of the correlation characteristic obtained in this manner via the delay time of the marker signal, and finally adjusting the adjustable digital delay devices assigned to the digital-to-analog converters to the time value corresponding to this maximum.

With the arrangement according to the invention, an accurate synchronization of the analog signals at the output of the digital-to-analog converters can be set via the adjustable digital time-delay device. In the simplest case, with only two digital-to-analog converters, as for example when generating analog I and Q signals from a given I/Q digital signal data stream, it is sufficient if only one adjustable, digital delay device is assigned to the one digital-to-analog converter. However, primarily if a synchronization of the analog signals with an additional marker signal is required, corresponding adjustable digital delay devices are expediently assigned to each of the digital-to-analog converters.

Each adjustable digital delay device upstream of the digital-to-analog converters preferably includes a delaying circuit, of which the delay is adjustable to a whole clock-pulse period, and an interpolation filter arranged in cascade with the latter, of which the delay is adjustable to fractions of a clock-pulse period. Delaying circuits of this kind are known, for example, as so-called delay-pipelines or filters. They can be regarded as known components in the field of electronics. A delaying circuit, of which the delay is adjustable only to whole-number clock-pulse periods, is used to delay the marker signal. Adjustable filters, which can be set for fractions of the clock pulse, are available, for example, from Logic Devices under the trade name LT 4420 or LF 3320. Adjustable delay pipelines are also commercially available.

The arrangement according to the invention is in fact primarily advantageous for the synchronization of two digital-to-analog converters, as used for the generation of I/Q analog signals; however, it is also advantageous for other applications, in which analog output signals from three or more digital-to-analog converters have to be synchronised.

BRIEF DESCRIPTION OF THE DRAWINGS

The invention is explained in greater detail below with reference to schematic drawings of two exemplary embodiments.

DETAILED DESCRIPTION

Figure 1:
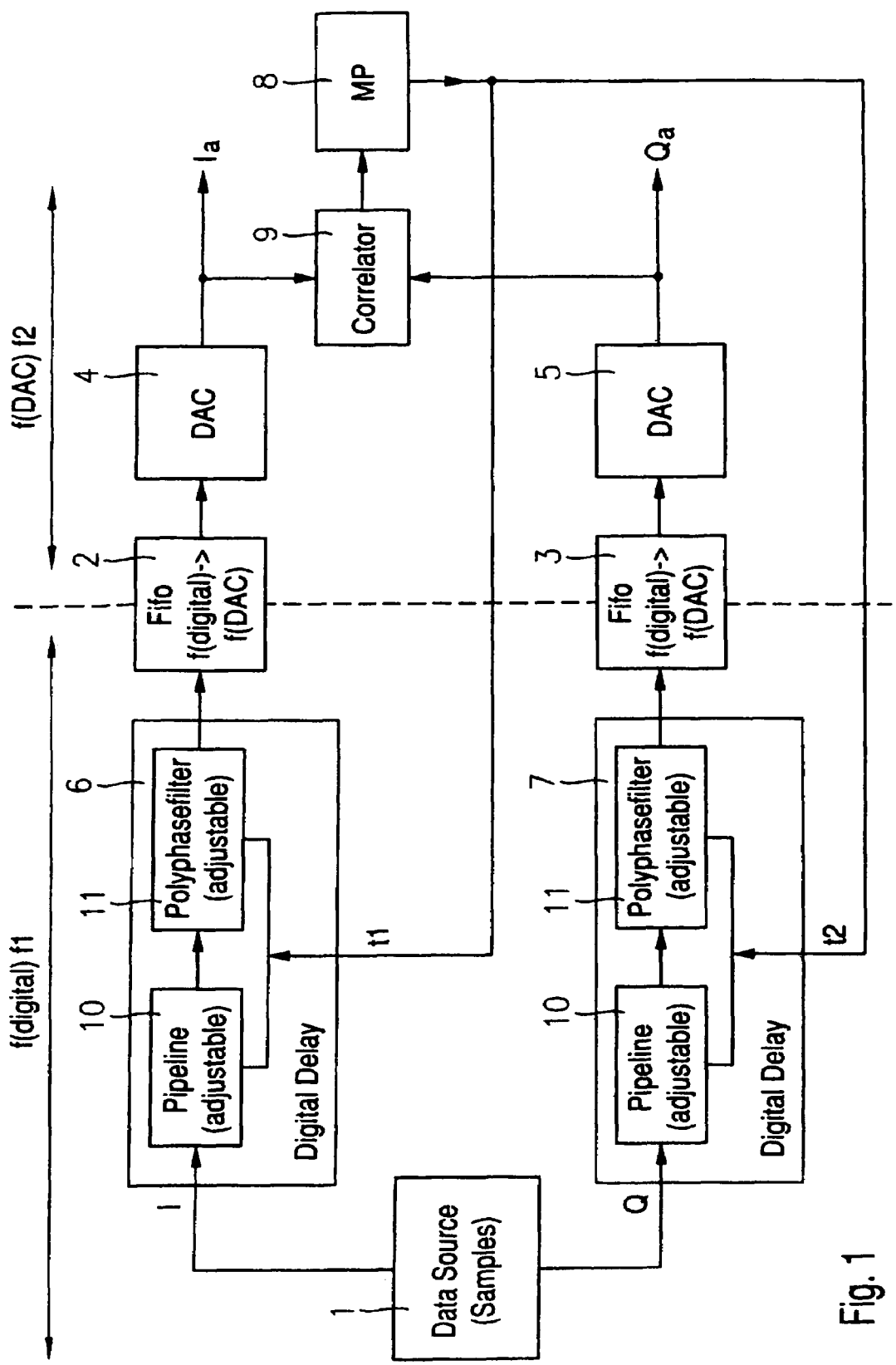
FIG. 1 shows the block circuit diagram of an arrangement according to the invention for synchronizing two digital-to-analog converters without marker signal.

In the exemplary embodiment shown in FIG. 1, two digital data signals I and Q are supplied from a data source 1 with a clock pulse $f_1$ via fifo memories 2 and 3 to respective digital-to-analog converters 4 and 5. The fifo memories 2 and 3 are generally already integrated in the digital-to-analog converters. The digital-to-analog converters 4 and 5 operate with a particularly pure system clock pulse $f_2$. In the example, an adjustable digital delay device 6 and respectively 7, of which the delay time t1 and respectively t2 is adjustable via microprocessor 8 dependent upon a correlator 9, is arranged upstream of each of the fifo memories 2 and 3. Each of the two digital delay devices 6 and 7 preferably includes a respective delaying circuit 10, of which the delay time is adjustable to whole clock-pulse periods, for example, a so-called delay pipeline, and an interpolation filter 11 arranged in cascade with the latter, of which the delay time is adjustable to fraction of a clock-pulse period.

The analog output signals $I_a$ and respectively $Q_a$ of the two digital-to-analog converters 4 and 5 undergo a cross-correlation in the correlator 9. A correlation characteristic, of which the maximum determines the delay times t1 and respectively t2 of the two digital delay devices 6 and 7, is obtained by relative displacement of the two analog signals relative to one another and measurement of the correlation function.

This mathematical cross-correlation of two functions and measurement of the maximum of the correlation characteristic takes place in the correlator 9 in a known manner; the result of the maximum measurement is converted in the computer 8 in order to adjust the delay times t1 and t2. For this adjustment of delay times dependent upon the cross-correlation, a corresponding digital synchronization pattern is preferably supplied to the input of the arrangement, which provides an output signal particularly favorable for the correlation, for example, a so-called Gaussian pulse.

Figure 2:
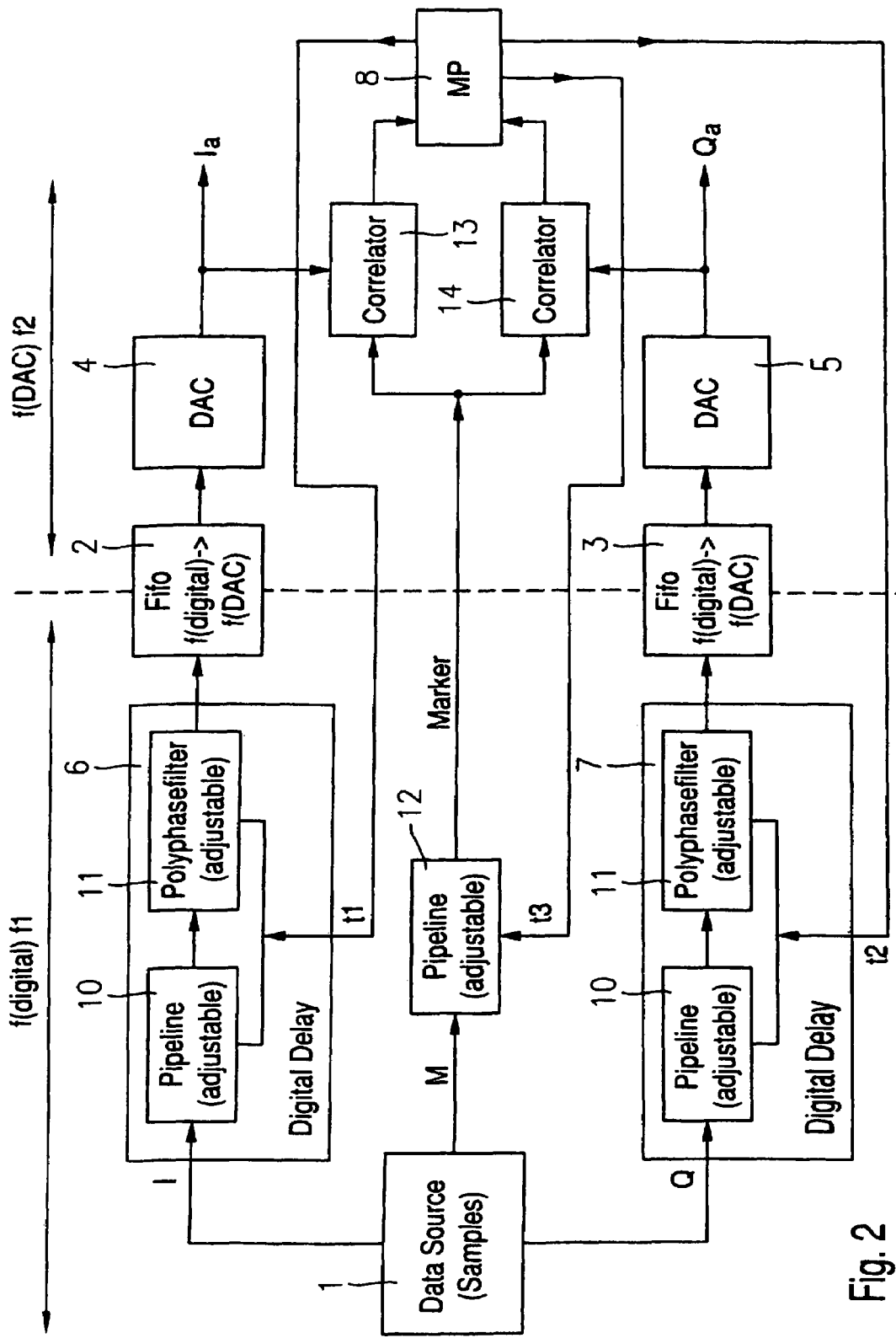
FIG. 2 shows the same arrangement for synchronising two analog signals with an additional marker signal.

FIG. 2 shows an arrangement, in which a marker signal M, generated together with the digital signals, is also supplied directly to the output from the data source 1 in addition to the digital signals I and Q. The other components of the arrangement are the same as those shown in FIG. 1 and are therefore indicated with the same reference numbers. The marker signal M is also provided with a time delay via an adjustable digital delay device 12 and supplied to two correlators 13 and 14, which for their part, once again via the computer 8, implement the adjustment of the three respective delay times t1, t2, t3. In the correlator 13, the output signal $I_a$ is correlated with the marker signal M, and in the correlator 14, the marker signal M is correlated with the output signal $Q_a$. In this example, the marker signal is used as the reference signal, to which the two output signals $I_a$ and $Q_a$ are synchronised.

The adjustment of the digital delay devices according to FIG. 2 is implemented as follows:

Initially, after switching on the system, the two digital delay devices 6 and 7 are set to zero (t1=0, t2=0).

A digital synchronization pattern suitable for the synchronization is then supplied from the data source 1 to both signal paths I and Q and also to the marker channel, for example, the data sequence 00011000 on the marker channel, and a digital signal, which generates a Gaussian pulse at the output of the digital-to-analog converter, on the signal path. With this synchronization pattern, the delay time t3 of the digital delay device 12 is then altered in whole clock-pulse periods, and at the same time, the correlation function between the marker signal and the analog output signals is measured via the correlators 13 and 14 respectively.

A correlation characteristic over the delay time t3 is then obtained in a known manner. By interpolation of the maximum of this characteristic, the optimum delay time t1 or respectively t2 is determined in each of the correlators 13 and 14. The actual delay time of the analog signals is disposed at the position of the maximum. The time value t1 or respectively t2 is set in the digital delay devices via the computer 8. The analog signals $I_a$ and $Q_a$ are then output in exact synchronization with one another and with the marker signal.

The invention is not restricted to the exemplary embodiments presented. All the features described and illustrated can be combined with one another as required. Moreover, the correlator need not be arranged directly after the digital-to-analog converters; any required signal transmission distance may be disposed between the output component and the correlator. In this manner, any unknown signal transmission times can be adapted to one another.

The invention claimed is:

1. Arrangement for the synchronous output of analog signals generated in at least two digital-to-analog converters, wherein the digital signals are generated at a first clock-pulse frequency and converted into analog signals in the digital-to-analog converters at a second clock-pulse frequency, and the signal is transferred with a delay to the digital-to-analog converters via a fifo memory, comprising an adjustable digital delay device arranged upstream of each fifo memory of each of the digital-to-analog converters for delaying the digital signals, of which the delay time is adjustable dependent upon the cross-correlation determined between the analog output signals of the digital-to-analog converters upstream of a fifo memory upstream of at least one of the digital-to-analog converters.

2. Arrangement according to claim 1, wherein each adjustable digital delay device comprises an adjustable digital delaying circuit, of which the respective delay time is adjustable by a whole clock period, and a digital interpolation filter arranged in cascade with the latter, of which the delay time is adjustable to fraction of a clock-pulse period.

3. Arrangement according to claim 1 adapted for simultaneous generation and transmission of a marker signal with the digital signals directly to the output and direct transmission of the marker signal to the output via an adjustable digital delay device, and adjustment or the delaying time of the marker signal and the delaying times of the digital signals supplied to the digital-to-analog converters dependent upon the cross-correlation, which is determined between the analog output signals of the digital-to-analog converters and the delayed marker signal.

4. Arrangement according to claim 3, wherein the adjustable digital delay device assigned to the marker signal is a delaying circuit adjustable to whole-number clock-pulse periods.

5. Arrangement according to claim 3, wherein the respective adjustable digital delay devices are controlled at the first clock-pulse frequency.

6. Method for adjusting an arrangement according to claim 3 for the synchronous output of analog signals with associated marker signals generated in at least two digital-to-analog converters comprising initially adjusting the digital delay devices assigned to the digital-to-analog converters to a delay time of zero, then supplying a synchronization pattern as a digital signal with assigned marker signal, altering the delay of the marker signal by the adjustable digital delay device assigned to the latter, and simultaneously marking the cross-correlation function between the analog signals of the digital-to-analog converters and the marker signal, determining the maximum of the correlation characteristic obtained in this manner via the delay time of the marker signal, and finally adjusting the adjustable digital delay devices assigned to the digital-to-analog converters to the time value corresponding to this maximum.

* * * * *